(12) United States Patent
Schneegans et al.

(10) Patent No.: US 7,674,689 B2
(45) Date of Patent: Mar. 9, 2010

(54) METHOD OF MAKING AN INTEGRATED CIRCUIT INCLUDING SINGULATING A SEMICONDUCTOR WAFER

(75) Inventors: Manfred Schneegans, Vaterstetten (DE); Werner Kroninger, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 71 days.

(21) Appl. No.: 11/858,437

(22) Filed: Sep. 20, 2007

(65) Prior Publication Data

US 2009/0079038 A1    Mar. 26, 2009

(51) Int. Cl.
*H01L 21/46* (2006.01)
(52) U.S. Cl. .............. 438/462; 438/458; 257/E21.596; 257/E21.599
(58) Field of Classification Search ................. 438/458, 438/459, 460, 462, 464, 33, 68, 113; 257/E21.596, 257/E21.599
See application file for complete search history.

(56) References Cited

U.S. PATENT DOCUMENTS

| | | | |
|---|---|---|---|
| 6,790,709 B2 | 9/2004 | Dias et al. | |
| 6,812,548 B2 * | 11/2004 | Dias et al. | 257/620 |
| 6,943,429 B1 | 9/2005 | Glenn et al. | |
| 6,951,801 B2 | 10/2005 | Pozder et al. | |
| 6,955,947 B2 | 10/2005 | Dias et al. | |
| 2007/0119892 A1 * | 5/2007 | Horsfield | 225/2 |
| 2008/0014439 A1 * | 1/2008 | Bol | 428/337 |

* cited by examiner

*Primary Examiner*—Quoc D Hoang
(74) *Attorney, Agent, or Firm*—Dicke, Billig & Czaja, PLLC

(57) ABSTRACT

A method of making an integrated circuit includes providing a semiconductor wafer having a first surface and a second surface opposite the first surface, at least one of the first surface and the second surface including a metallization layer deposited onto the surface. The method additionally includes forming a first trench in the semiconductor wafer extending from one of the first surface and the second surface toward an other of the first surface and the second surface. The method further includes sawing a second trench in the other surface until the second trench communicates with the first trench, thus singulating the integrated circuit from the semiconductor wafer.

23 Claims, 10 Drawing Sheets

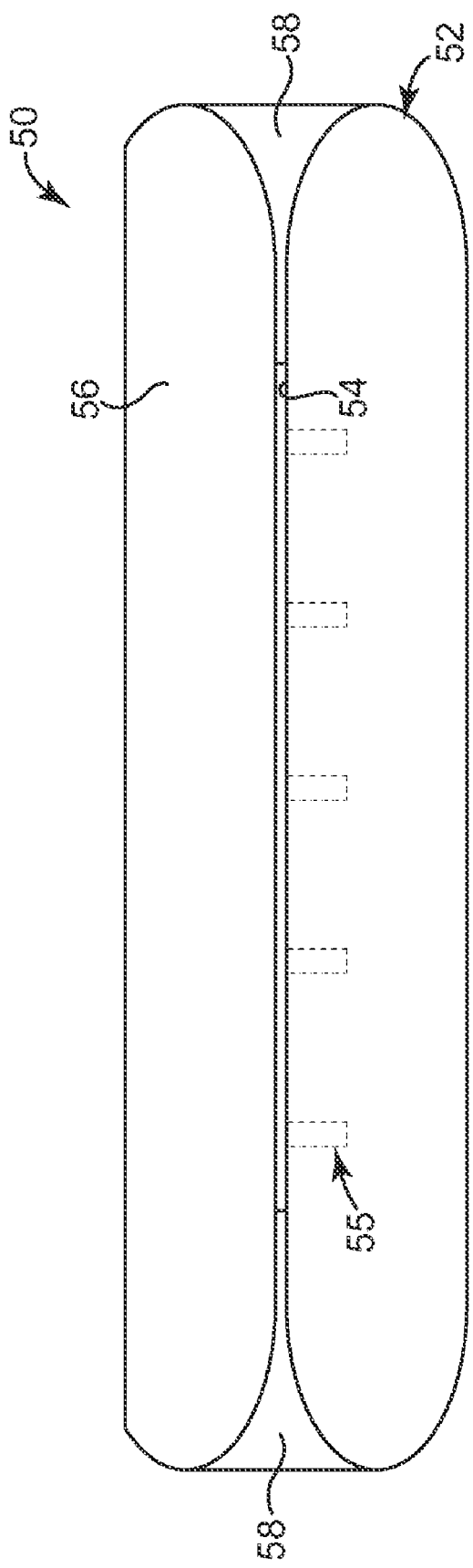
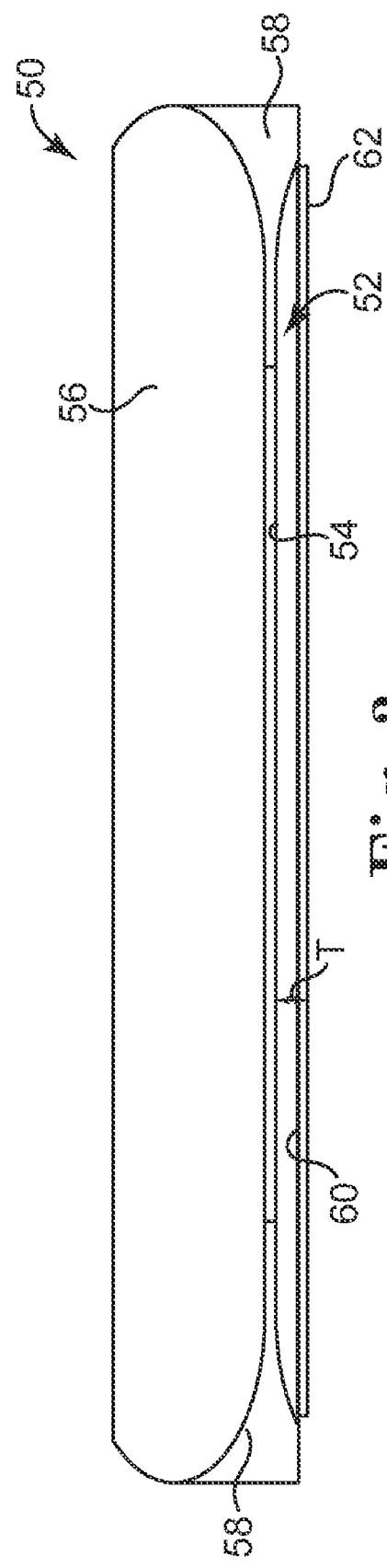
Fig. 2
Fig. 3

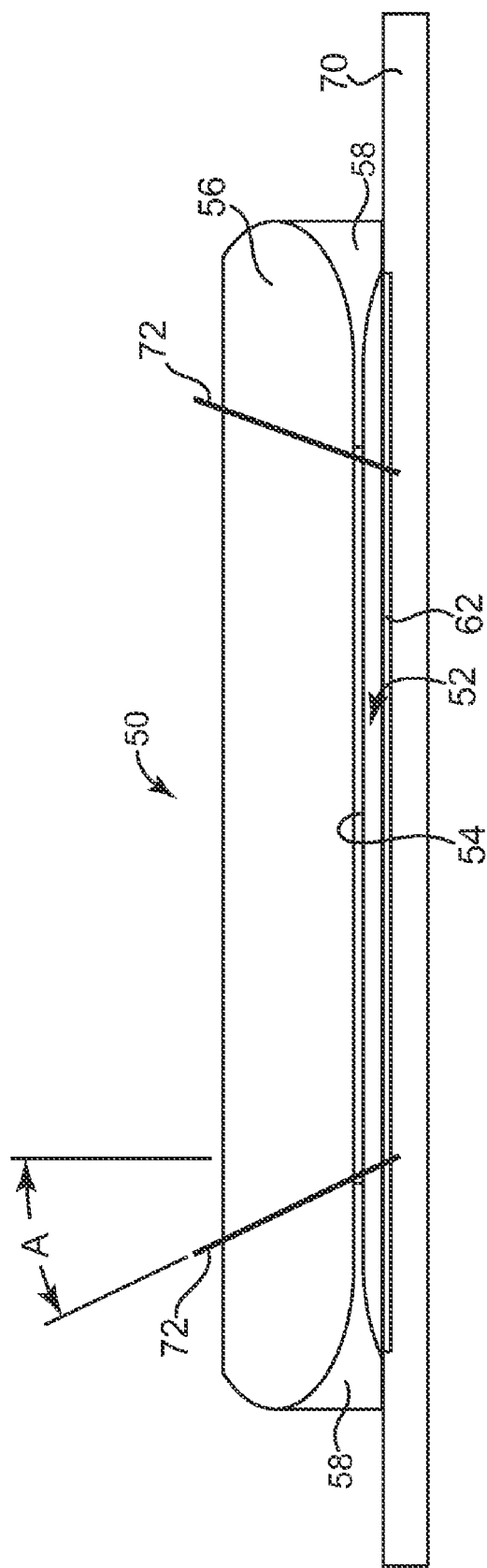
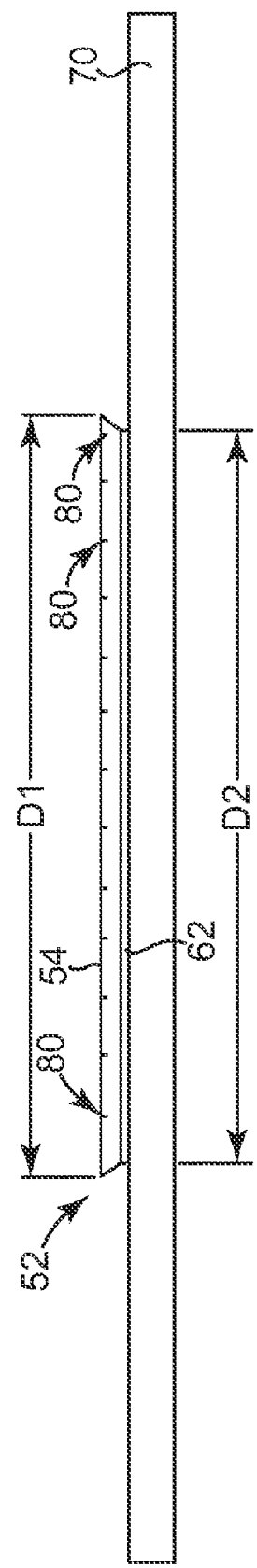

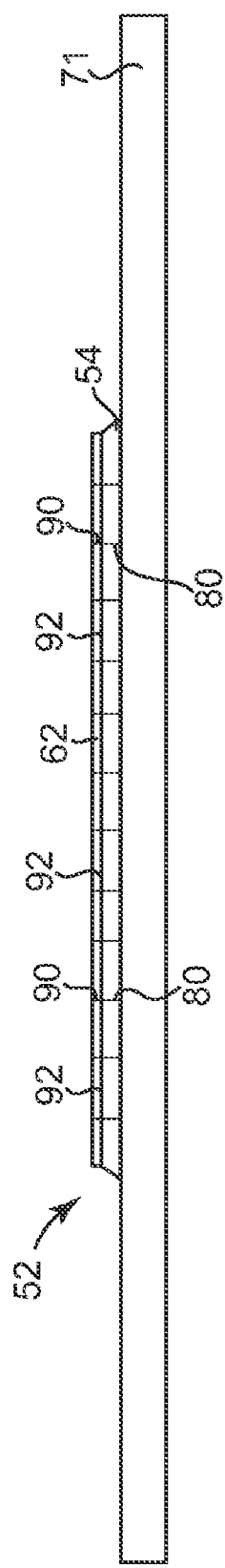

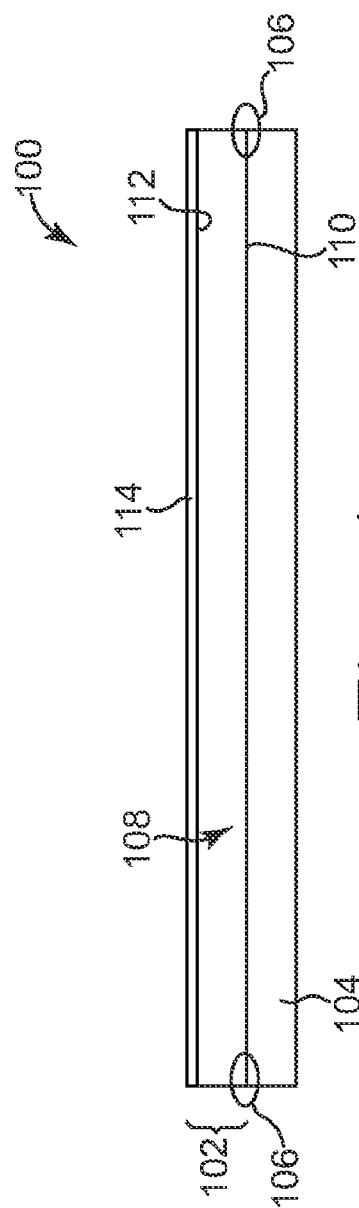
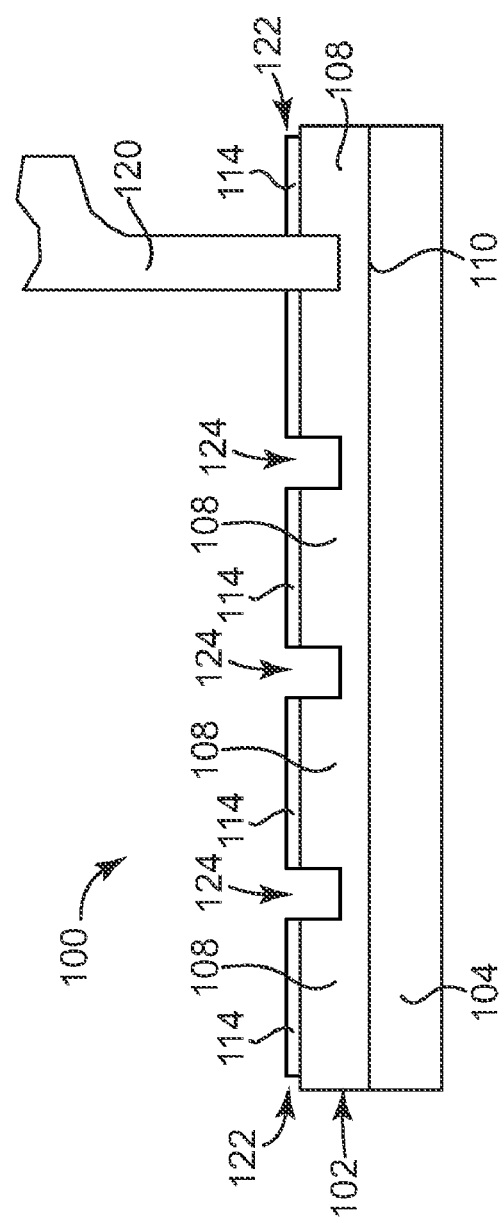

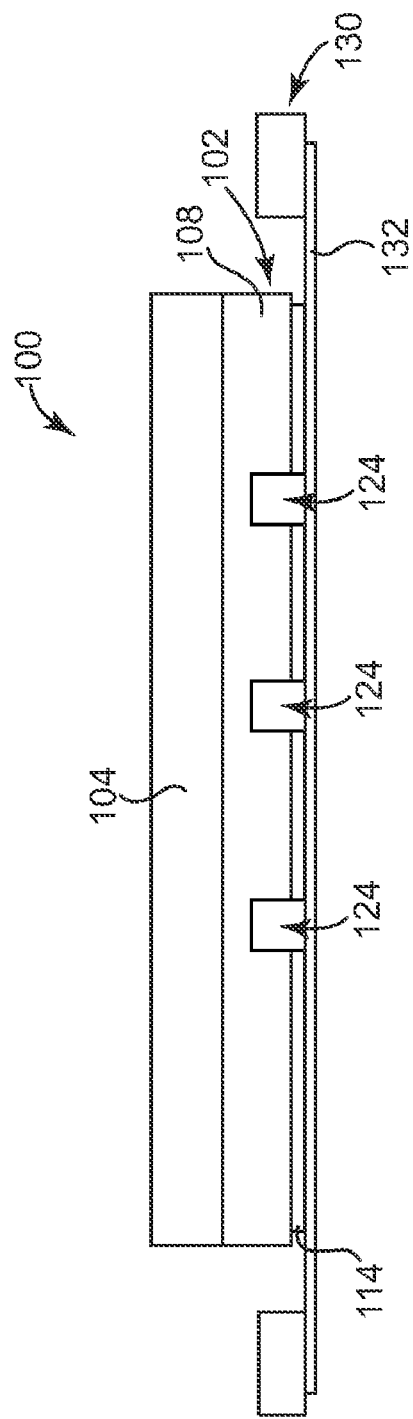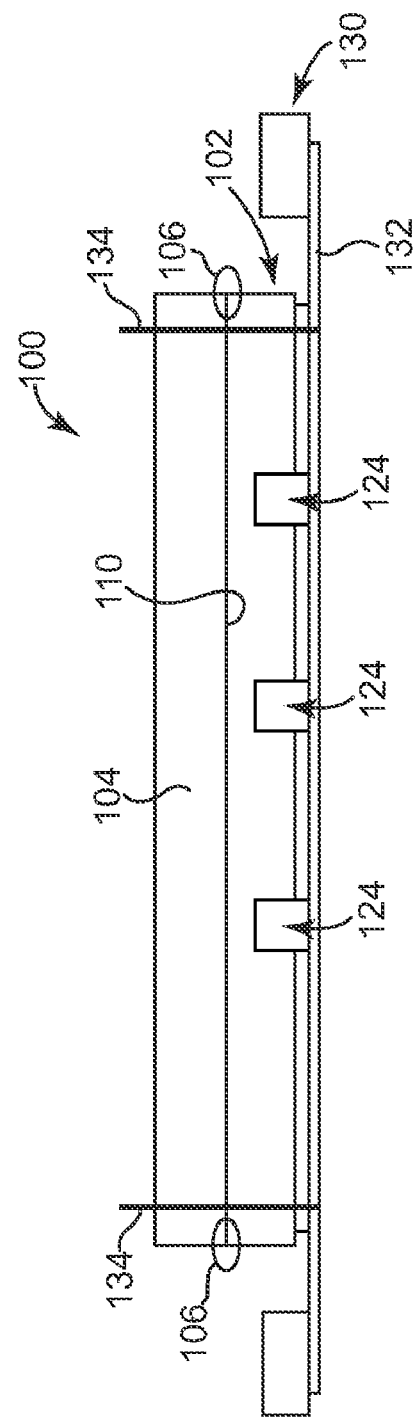

METHOD OF MAKING AN INTEGRATED CIRCUIT INCLUDING SINGULATING A SEMICONDUCTOR WAFER

BACKGROUND

Market demand for smaller and more functional electronic devices has driven the development of semiconductor devices, packages, and highly functional chips. Multiples of these functional chips are formed on a surface of a semiconductor wafer and include specific, desired chip properties. The semiconductor wafer includes a semiconductor substrate having a metal layer on one side and an active surface opposite the metal layer. The metal layer is configured to provide electrical connection for each chip after the chip is separated from the wafer. The active surface is fabricated to include contact pads that provide electrical access to the chip. After fabrication, the chips are cut or singulated from the semiconductor substrate and suited for individual use in electronic devices.

FIG. 1 is a cross-sectional view of a conventional semiconductor substrate 20. The known semiconductor substrate 20 includes a silicon portion 22 defining an active surface 24, a back side 26 opposite active surface 24, and a metal layer 28 deposited on back side 26. Semiconductor substrate 20 is fabricated to include a plurality of chips (not shown) deposed in the plane of active surface 24. After fabrication of semiconductor substrate 20, it is desired to separate, or singulate, the individual chips by sawing semiconductor substrate 20 from active surface 24 down to back side 26 and through metal layer 28.

It is known that sawing through metal layer 28 is likely to produce burrs 30, and/or cracks 32. Burrs 30 and cracks 32 are highly undesirable. Burrs 30 extend from metal layer 28 and deleteriously affect electrical performance/contact of the chip when coupled to another electronic device. Cracks 32 can potentially interrupt the electrical contact between the silicon layer 22 and metal layer 28. In addition, cracks 32 in silicon portion 22 are known to propagate when the chip is thermally cycled, thus possibly interrupting electrical connection for the chip.

Dicing or cutting semiconductor substrate 20 from metal layer 28 through silicon layer 22 is problematic because the chip pattern (or kerf) on active surface 24 is not visible from the metal layer 28 side. Thus, blindly sawing semiconductor substrate 20 from metal layer 28 toward active surface 24 has the potential of damaging the unseen chips on active surface 24.

For these and other reasons there is a need for the present invention.

SUMMARY

One aspect provides a method of making an integrated circuit. The method includes providing a semiconductor wafer having a first surface and a second surface opposite the first surface, at least one of the layers of the first surface and the second surface including a metallization layer deposited onto the surface. The method additionally includes forming a first trench in the semiconductor wafer extending from one of the first surface and the second surface toward another of the first surface and the second surface. The method further includes sawing a second trench in the other surface until the second trench communicates with the first trench, thus singulating the integrated circuit from the semiconductor wafer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 is a side view of a carrier assembly including a product wafer coupled to a carrier wafer according to one embodiment.

FIG. 3 is a side view of the carrier assembly shown in FIG. 2 after the product wafer has been ground and coated with a metallization layer to define a semiconductor substrate according to one embodiment.

FIG. 4 is a side view of the semiconductor substrate shown in FIG. 3 coupled to an adhesive carrier according to one embodiment.

FIG. 5 is a side view of the semiconductor substrate shown in FIG. 4 illustrating a diced active surface according to one embodiment.

FIG. 7B is side view of singulated semiconductor chips coupled to a tape carrier according to one embodiment.

FIG. 8A is a side view of a semiconductor substrate mounted on a carrier according to another embodiment.

FIG. 8B is a side view of a dicing blade sawing a trench through a metalized back side of the semiconductor substrate shown in FIG. 8A.

FIG. 8C is a side view of the sawn metalized back side illustrated in FIG. 8B mounted on a film of a clamp assembly.

FIG. 8D is a side view showing removal of the carrier illustrated in FIG. 8A.

DETAILED DESCRIPTION

Figure 1:
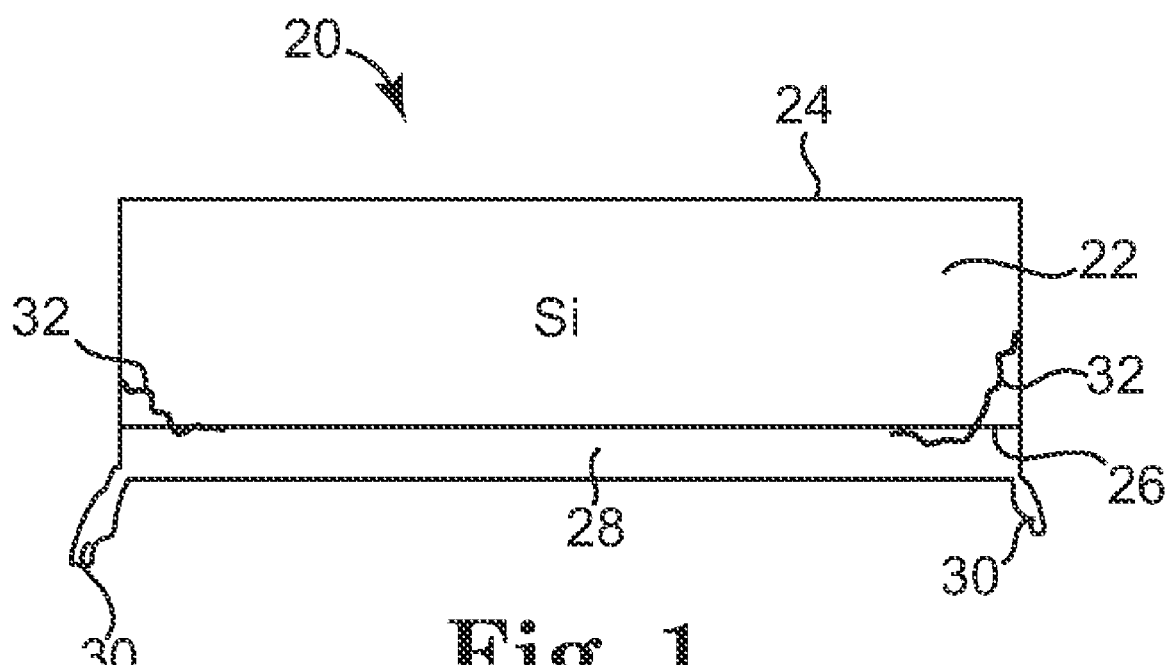
FIG. 1 is a cross-sectional view of a semiconductor substrate as known in the art.

In the following Detailed Description, reference is made to the accompanying drawings, which form a part hereof, and in which are shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Embodiments provide a method of sawing a semiconductor substrate including a silicon wafer portion and a metal layer portion that minimizes or eliminates the formation of burrs and/or cracks when sawing through the semiconductor substrate. Some embodiments provide for the partial dicing through a semiconductor substrate. Dicing part way through the substrate, for example through an active surface of the semiconductor substrate, provides an alignment feature that enables full-thickness dicing of the substrate through a metallized back side. In one embodiment, the partial dicing alignment feature enables alignment of the metallized back side with kerf lines/dicing lines formed on the active surface of the semiconductor substrate. In this manner, final dicing streets that are cut through the metallization layer align with the partial/initial dicing streets sawn through the active surface of the semiconductor substrate.

Other embodiments provide for the removal of a portion of a metallization layer deposited on a back side of a semiconductor substrate, where the removed portion of the metallization layer enables optical alignment of the metallized back side with kerf lines on an opposing active surface of the semiconductor substrate. To this end, the back side metallization layer is first sawn in alignment with the kerfs on the active surface, and a second subsequent sawing of the active surface singulates chips from the semiconductor substrate.

In other embodiments, first trenches or streets are diced in a first surface of the semiconductor substrate, where the first streets imprint or otherwise transfer a cutting pattern to the opposite surface of the semiconductor substrate. Thereafter, the imprinted surface of the semiconductor substrate may be accurately sawn in alignment with the first streets.

The various embodiments of partial dicing of streets in a semiconductor substrate solves the problem known in the art of forming metal burrs when the semiconductor substrate is diced from the kerf lines on the active surface down to the metallization layer. In addition, the partial dicing of streets in a semiconductor substrate as described herein minimizes or eliminates the undesirable formation of cracks in the silicon portion of the substrate.

FIG. 2 is a side view of a carrier assembly 50 according to one embodiment. Carrier assembly 50 includes a semiconductor substrate 52 having an active surface 54, where semiconductor substrate 52 is coupled to a carrier wafer 56 by adhesive 58.

Semiconductor substrate 52 includes silicon wafers having a diameter of about 100 to about 300 millimeters. In one embodiment, semiconductor substrate 52 is provided as a thick product wafer having semiconductor chips (not shown) formed on active surface 54. Active surface 54 of semiconductor substrate 52 is oriented toward carrier wafer 56. The chips are aligned in rows and columns across active surface 54, where the space between the rows and columns of chips define a kerf pattern 55. Subsequent to fabrication, the chips are singulated from semiconductor substrate 52 by sawing or dicing along the kerf to provide individual chips useful in electronic components.

Carrier wafer 56 is coupled over active surface 54 by glue 58. In one embodiment, carrier wafer 56 is a thin silicon carrier wafer configured to protect active surface 54 during fabrication of semiconductor substrate 52. In one embodiment, an outer perimeter of semiconductor substrate 52 is coupled to an outer perimeter of carrier wafer 56 by adhesive material 58. Adhesive material 58 includes epoxies, glues, and other materials suited for adhesively coupling carrier wafer 56 to product wafer 52.

FIG. 3 is a side view of carrier assembly 50 illustrating semiconductor substrate 52 after thinning according to one embodiment. In one embodiment, semiconductor substrate 52 is ground to reduce its thickness, which defines a back side 60 opposite active surface 54. In one embodiment, a metallization layer 62 is deposited onto back side 60 of semiconductor substrate 52, such that semiconductor substrate 52 includes active surface 54 and a metal layer 62 opposite active surface 54.

In one embodiment, semiconductor substrate 52 is thinned by grinding to have a thickness T of between about 40-60 micrometers, although other thicknesses are also acceptable. In one embodiment, metallization layer 62 is deposited onto back side 60 to have a thickness of between about 1-8 micrometers. Metallization layer 62 is deposited in a suitable deposition process, including a vapor deposition process, a chemical vapor deposition process, a plasma vapor deposition process, sputtering, or other suitable deposition process employed to coat a thin layer of metal 62 onto back side 60 of semiconductor substrate 52.

FIG. 4 is a side view of carrier assembly 50 coupled to a carrier tape 70 according to one embodiment. In one embodiment, metallization layer 62 is coupled to carrier tape 70 and active surface 54 is oriented toward carrier wafer 56. In one embodiment, carrier tape 70 is a single sided adhesive tape configured to carry semiconductor substrate 52 through fabrication processes. In another embodiment, carrier tape 70 is a saw foil 70, although other forms of tape are also acceptable.

In one embodiment, a separation line 72 is provided that removes carrier wafer 56 from semiconductor substrate 52 by cutting within the perimeter of adhesive 58. In one embodiment, separation line 72 is provided by a laser or other energetic cutting procedure in which a cut is provided to remove carrier wafer 56 from carrier assembly 50. In one embodiment, separation line 72 is oriented at an angle A relative to vertical such that separation line 72 is a sloped cutting line and semiconductor substrate 52 includes beveled edges. In one embodiment, separation line 72 does not sever carrier tape 70, such that carrier tape 70 is available for subsequent fabrication of semiconductor substrate 52.

FIG. 5 is a side view of semiconductor substrate 52 after the removal of carrier wafer 56 (FIG. 4) from carrier assembly 50. Angled separation line 72 (FIG. 4) severs semiconductor substrate 52 such that active surface 54 has a first diameter D1 and metallization layer 62 has a second diameter D2. In one embodiment, D1 is greater than D2 such that semiconductor substrate 52 is beveled in a manner that active surface 54 extends beyond metallization layer 62.

In one embodiment, semiconductor substrate 52 is oriented on carrier tape 70 such that active surface 54 is oriented up (relative to FIG. 5) and configured for dicing or sawing by a dicing blade. As noted above, active surface 54 includes a plurality of semiconductor chips oriented in columns and rows, where the chips are separated by a kerf. The layout of the chips, and the kerf, is visible on active surface 54. Sawing along the kerf ensures accurate singulation of semiconductor substrate 52. However, sawing along the kerf from active surface 54 down to metallization layer 62 has the potential to form undesirable metal burrs and cracks in the silicon wafer.

In one embodiment, a plurality of first trenches 80 are formed in active surface 54 that dice or extend partially into the thickness of semiconductor substrate 52. In one embodiment, first trenches 80 are half-cut diced into active surface 54 and extend part-way toward metallization layer 62. In this specification, half-cut dice means a cut street that extends between 10-90% of the thickness of semiconductor substrate 52. In some embodiments, a half-cut diced street extends about midway through semiconductor substrate 52, although first trenches 80 could extend more than 50% or less than 50% through semiconductor substrate 52 consistent with the definition of half-cut diced.

In one embodiment, sawing front side active surface 54 of semiconductor wafer substrate 52 transfers a saw pattern to back side 60 of semiconductor wafer substrate 52 and/or metallization layer 62 that is configured to visually guide sawing second trenches in back side 60 of the semiconductor wafer substrate 52. As described below, half-cut dicing of the front/active surface 54 enables matching the dicing marks on the active surface 54 with a desired saw pattern on the back side or metallization layer 62.

Figure 6:
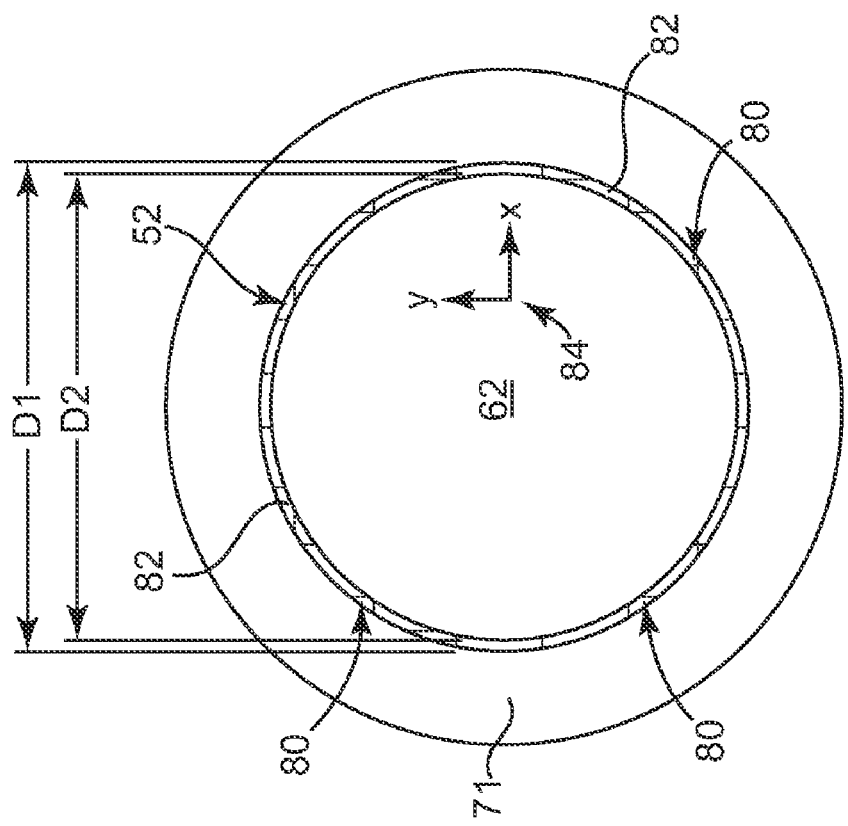
FIG. 6 is a back side view of exposed and un-diced metallization layer with the diced active surface of the semiconductor substrate mounted to another adhesive carrier according to one embodiment.

FIG. 6 is a back side view of metallization layer 62 showing active surface 54 of semiconductor substrate 52 coupled to another adhesive carrier 71. Metallization layer 62 is exposed (oriented up relative to FIG. 6) and prevents the optical, infrared or otherwise, visualization of first trenches 80. Active surface 54 including first trenches 80 has been coupled to adhesive carrier 71. Active surface 54 has a diameter D1 that is larger than diameter D2 of metallization layer 62. In this manner, first trenches 80 formed an active surface 54 are visible around a periphery 82 of metallization layer 62.

In one embodiment, the visible first trenches 80 disposed around and extending beyond the periphery 82 of metallization layer 62 enables alignment of metallization layer 62 along a direction of first trenches 80. In this manner, a dicing tool is aligned with and enabled to cut/dice a second set of trenches that will align with first trenches 80. In one embodiment, beveled separation line 72 (FIG. 4) is configured such that diameter D1 is greater than diameter D2 and thus provides a transfer alignment mechanism that enables metallization layer 62 to be aligned with first trenches 80 prior to cutting of second trenches in metallization layer 62. For example, in one embodiment an X-Y axis 84 of semiconductor substrate 52 is spatially oriented such that metallization layer 62 is aligned with first trenches 80 and with a desired cutting direction for second trenches.

Figure 7A:
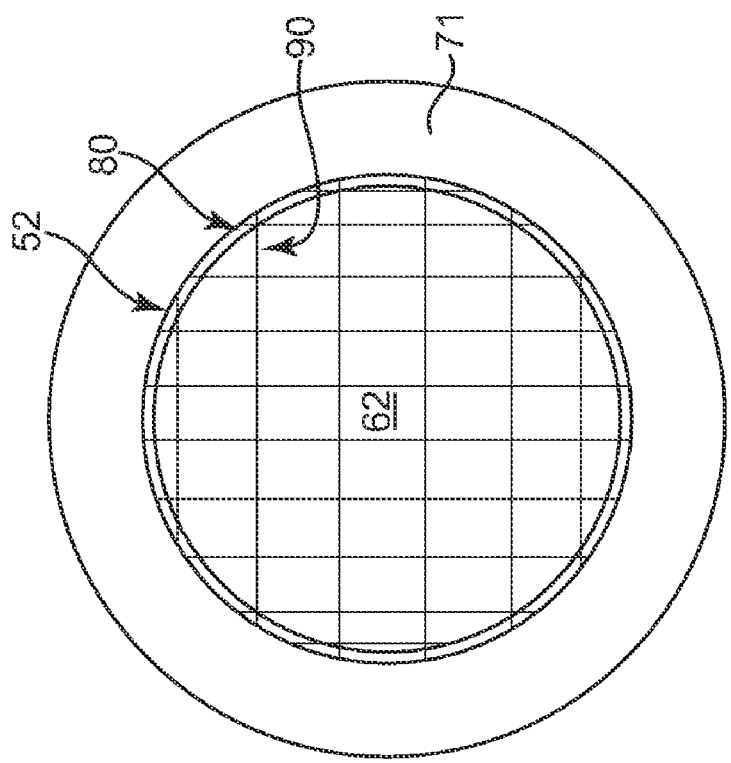
FIG. 7A is a back side view after dicing of the metallization layer shown in FIG. 6.

FIG. 7A is a back side view of semiconductor substrate 52 including second trenches 90 cut into metallization layer 62 in alignment with first trenches 80.

FIG. 7B is a side view of semiconductor substrate 52 including singulated chips 92 according to one embodiment. In one embodiment, active surface 54 is in contact with carrier tape 71 and metallization layer 62 is oriented up relative to the illustration of FIG. 7B. First trenches 80 and second trenches 90 align and intersect such that chips 92 are singulated from semiconductor substrate 52 and retained by transfer tape 71. Chips 92 are coupled to transfer tape 71 in a manner that enables transportation and subsequent mounting of chips 92 to other electronic devices.

FIG. 8A is a side view of a semiconductor carrier assembly 100 according to another embodiment. Semiconductor carrier assembly 100 includes a semiconductor substrate 102 coupled to a carrier 104. In one embodiment, semiconductor substrate 102 is coupled to carrier 104 by an adhesive deposited about a periphery 106 of assembly 100, although other forms of coupling substrate 102 to carrier 104 are also acceptable.

In one embodiment, semiconductor substrate 102 includes a wafer 108 having an active surface 110 opposite a back side 112 and a metallization layer 114 coupled to back side 112. It is desired to dice or singulate semiconductor substrate 102 by cutting through metallization layer 114. However, metallization layer 114 forms an optical barrier to visualizing the kerf pattern on active surface 110 of semiconductor substrate 102. In addition, the metal of metallization layer 114 prevents other forms of optical visualization of active surface 110, including infrared imaging through semiconductor 102.

FIG. 8B is a side view of semiconductor carrier assembly 100 including a dicing blade 120 oriented along the kerf pattern on active surface 110 of semiconductor substrate 102. In one embodiment, an edge portion 122 of metallization layer 114 is removed from semiconductor substrate 102. Removal of edge portion 122 enables visualization of at least a portion of the kerf pattern on active surface 110, which enables alignment of dicing blade 120 between the chips formed on active surface 110. For example, in one embodiment infrared imaging is projected through the edge portion 122 and through silicon wafer 108 to provide a view of a portion of the front side kerf pattern formed on active surface 110. Thereafter, semiconductor substrate 102 is aligned such that dicing blade 120 is oriented along the visualized kerf pattern on the active surface 110. Dicing blade 120 dices or cuts a set of first trenches 124 through metallization layer 114 and through a portion of silicon wafer 108. First trenches 124 are half-cut diced through semiconductor substrate 102 such that metallization layer 114 is diced first, which has been found to minimize or eliminate the formation of metal burrs.

FIG. 8C is a side view of semiconductor carrier assembly 100 coupled to a clamp assembly 130 according to one embodiment. In one embodiment, metallization layer 114 is adhesively coupled to a flexible film 132 of clamp assembly 130 such that carrier 104 is oriented upwards.

FIG. 8D is a side view of carrier assembly 100 shown in FIG. 8C. In one embodiment, a cut line 134 is formed along the edge of semiconductor substrate 102 such that adhesive 106 at the periphery of assembly 100 is removed/separated. In one embodiment, a cut line 134 is formed by laser cutting, although other forms of providing cut line 134 are also acceptable. After cut line 134 is provided on assembly 100, carrier 104 is removed from semiconductor substrate 102 to expose active surface 110.

Figure 8E:
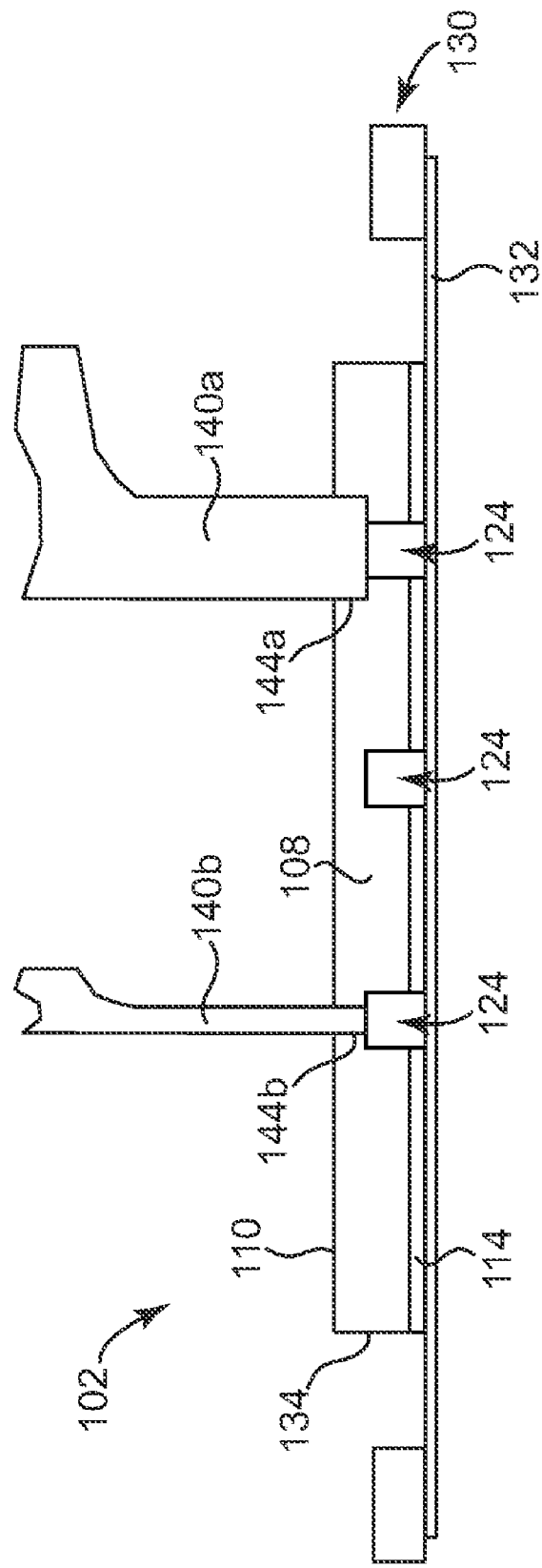
FIG. 8E is a side view showing a dicing blade cutting a trench into an active surface of the semiconductor substrate shown in FIG. 8A according to one embodiment.

FIG. 8E is a side view of semiconductor substrate 102 coupled to film 132 of clamp 130. Active surface 110 is oriented up and the chips and kerf on active surface are visible. First trenches 124 diced into metallization layer 114 are oriented down adjacent to film 132. In one embodiment, a wide dicing blade 140a dices a street along kerf of active surface 110 of semiconductor substrate 102 to form second trenches 144a that are aligned with first trenches 124. In one embodiment, wide dicing blade 140a has a width of between about 50-70 micrometers, preferably the width of wide dicing blade 140a is about 60 micrometers.

In another embodiment, a thin dicing blade 140b dices a street along kerf of active surface 110 of semiconductor substrate 102 to form second trenches 144b that are aligned with first trenches 124. In one embodiment, thin dicing blade 140b has a width of between about 10-30 micrometers, and preferably thin dicing blade 140*b* has a width of about 20 micrometers. Although both dicing blades 140*a*, 140*b* are illustrated, it is to be understood that dicing of semiconductor substrate 102 is accomplished by employing one of the illustrated dicing blades.

Embodiments provided above in FIGS. 8A-8E provide half-cut dicing part way into a metallized back side of a semiconductor substrate with a process that reduces or eliminates the formation of metal burrs. Cutting first trenches 124 into metallization layer 114 provides an efficient process for singulating chips from a semiconductor substrate that saves at least one processing step.

Figure 9A:
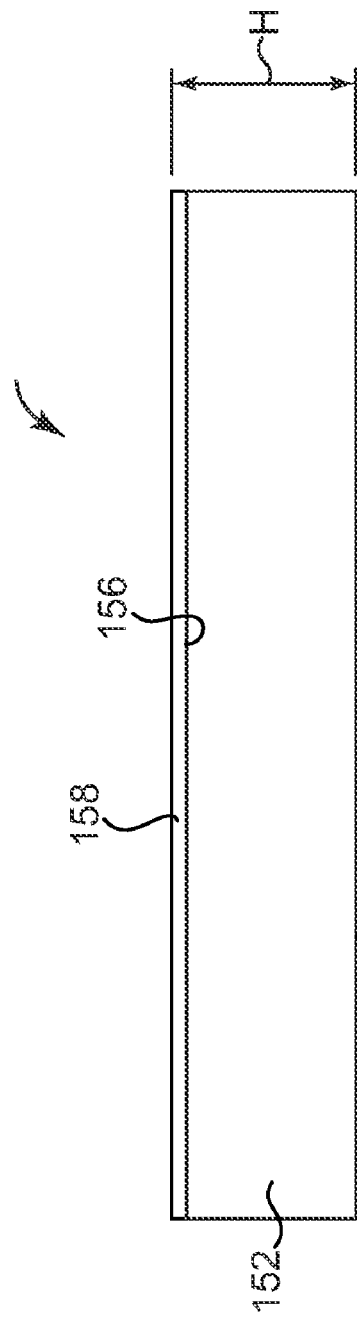
FIG. 9A is a side view of a thick semiconductor substrate oriented metallization layer up according to one embodiment.

FIG. 9A is a side view of a thick semiconductor substrate 150 according to another embodiment. Semiconductor substrate 150 includes a silicon wafer 152 including an active surface 154 opposite a back side 156 and a metallization layer 158 coupled to back side 156. In one embodiment, semiconductor substrate 150 has a thickness H of between about 600-800 micrometers, and typically semiconductor substrate 150 has a thickness H of about 725 micrometers. In one embodiment, semiconductor substrate 150 is half-cut diced through metallization layer 158 in a manner that minimizes or eliminates the formation of metal burrs and/or cracks in silicon wafer 152.

Figure 9B:
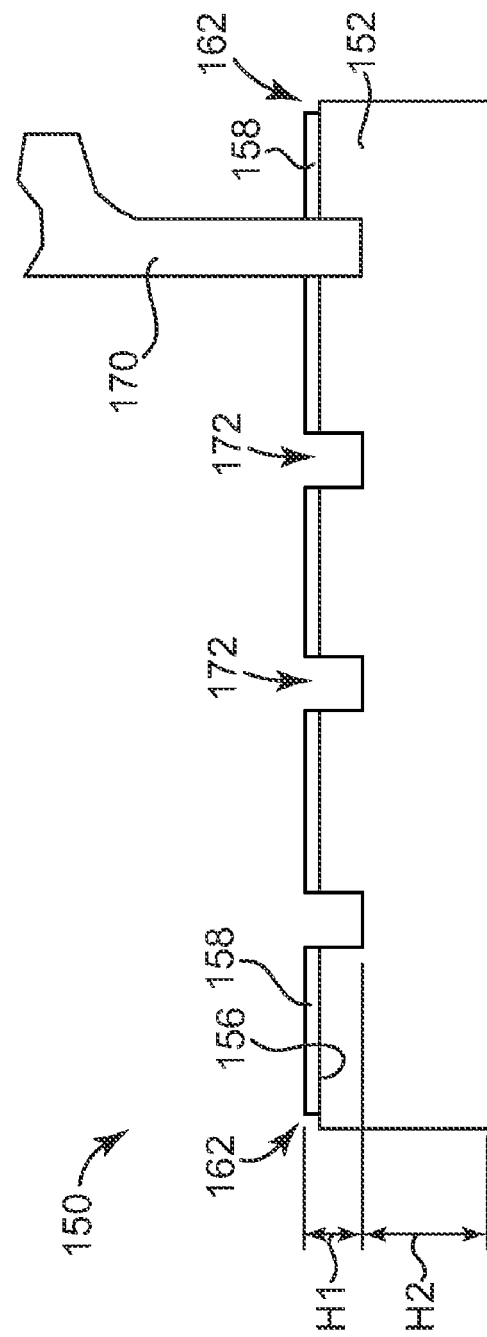
FIG. 9B is a side view of a first trench cut through the metallization layer of the semiconductor substrate shown in FIG. 9A.

FIG. 9B is a side view of semiconductor substrate 150 including an edge portion 162 of metallization layer 158 that has been removed to enable visualization of a front side kerf formed on active surface 154. In one embodiment, edge portion 162 of metallization layer 158 is removed down to back side 156 to enable infrared visualization of the front side kerf formed on active surface 154. In this manner, a dicing blade 170 is oriented relative to metallization layer 158 and in alignment with front side kerf on active surface 154, which enables alignment for cutting of a first set of trenches.

In one embodiment, a dicing blade 170 half-cut dices a set of first trenches 172 through metallization layer 158 and into a portion of silicon wafer 152. In one embodiment, first trenches 172 are diced through metallization layer 158 to a thickness of H1. In one embodiment, thickness H1 of first trenches 172 has a depth of between about 50-100 micrometers leaving a solid thickness H2 of silicon wafer 152. In one embodiment, thickness H2 provides stable silicon having a thickness of about 600 micrometers.

Figure 9C:
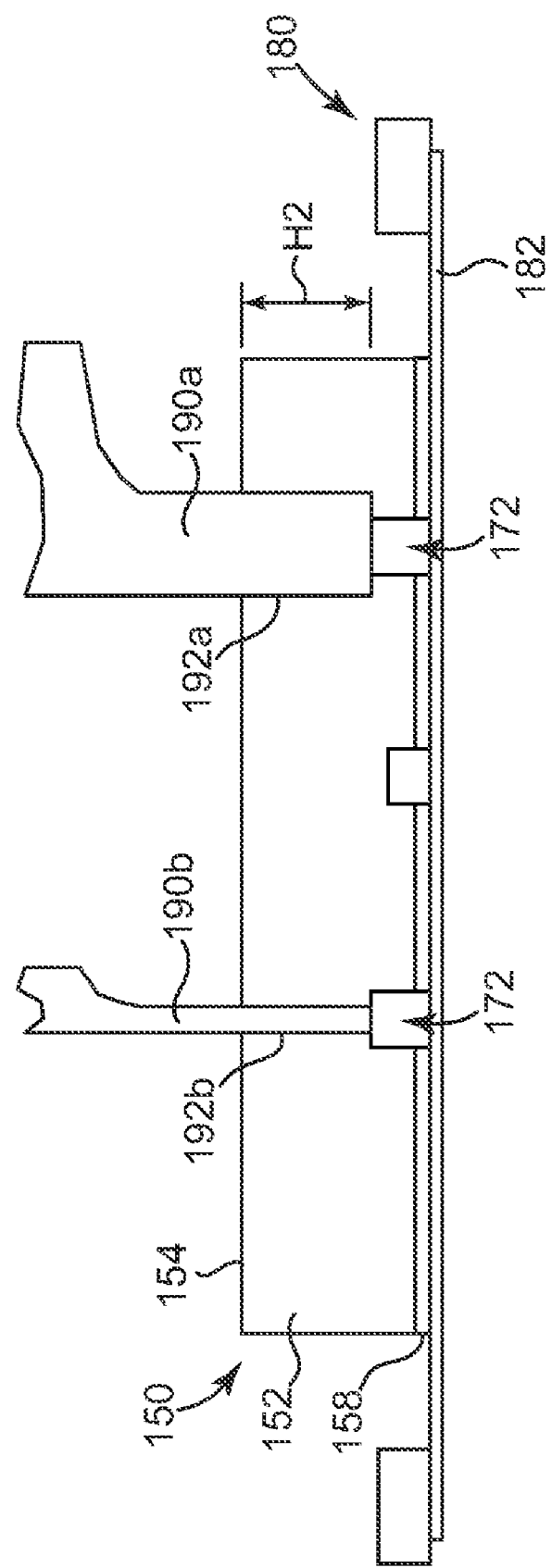
FIG. 9C is a side view of a second trench cut into an active surface of the semiconductor substrate shown in FIG. 9A.

FIG. 9C is a side view of semiconductor substrate 150 coupled to a thin film 182 of clamp 180. In one embodiment, metallization layer 158 is coupled to thin film 182 and active surface 154 including the visible front side kerf is oriented up.

In one embodiment, a relatively thick and stable portion of silicon wafer 152 remains and is presented for dicing and singulation. In one embodiment, silicon wafer 152 has a thickness H2 of silicon that is easily diced by dicing blades 190*a*, 190*b* in a manner that resists cracking. In one embodiment, H2 has a thickness of between about 550-650 micrometers.

In one embodiment, a thick dicing blade 190*a* dices a street along kerf of active surface 154 of silicon wafer 152 to form a second set of trenches 192*a* that align and intersect with first streets/trenches 172. Thick dicing blade 190*a* follows the front side kerf that is visible on active surface 154 and cuts streets 192*a* down to at least a thickness H2 such that second trenches 192*a* align with and meet first trenches 172. In one embodiment, thick dicing blade 190*a* is similar to wide dicing blade 140*a* (FIG. 8E) and has a width of about 60 micrometers.

In another embodiment, a thin dicing blade 190*b* dices a street along kerf of active surface 154 of silicon wafer 152 to form second trenches 192*b* through silicon wafer 152. In one embodiment, thin dicing blade 190*b* is similar to thin dicing blade 140*b* (FIG. 8E) and has a thickness of about between 10-30 micrometers and is employed to cut a set of second trenches 192*b* through at least the thickness H2. Second trenches 192*b* are aligned and cut through first trenches 172 to singulate chips from semiconductor substrate 150.

Embodiments provide the singulation a semiconductor substrate by aligning the un-diced metallized back side accurately with streets half-cut diced in the active side of a semiconductor substrate. In some embodiments, streets cut onto one side of the semiconductor substrate are transferred and aligned with the other, opposite side of the semiconductor substrate. Other embodiments provide cutting a first set of trenches into a semiconductor substrate through the metallized back side in a manner that minimizes or eliminates the formation and propagation of cracks through the silicon and minimizes or eliminates the creation of metal burrs.

In one embodiment, an active surface of a semiconductor substrate is half-cut diced with first trenches that imprint a pattern onto a metallized back side. The imprinted pattern on the back side is subsequently aligned and diced with streets to singulate chips from the semiconductor substrate. In other embodiments, a portion of the metallized back side is removed to enable visual alignment of the metallized back side with the front side kerf. A first set of trenches is formed in the metallized back side with a minimum formation of burrs. A second set of trenches is formed in the active surface of the semiconductor substrate, where the second streets/trenches align with the first trenches cut through the metallized back side.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments that provide a method of sawing a semiconductor substrate. Therefore, it is intended that this invention be limited only by the claims and the equivalents thereof.

What is claimed is:

1. A method of making an integrated circuit, the method comprising:

providing a semiconductor wafer comprising a front side and a back side opposite the front side, the front side having an active chip surface and coupled to a first carrier, the back side including a metallization layer deposited onto the backside;

forming a first trench in the semiconductor wafer extending from one of the front side and the back side toward the other of the front side and the back side; and sawing a second trench in the other of the front side and the back side until second trench communicates with the first trench, thus singulating the integrated circuit from the semiconductor wafer, wherein forming a first trench comprises:

attaching the metallization layer to an adhesive carrier;

decoupling the front side from the first carrier; and sawing the front side of the semiconductor wafer through a portion of the semiconductor wafer toward the back side to define dicing marks on the front side.

2. The method of claim 1, wherein providing a semiconductor wafer comprises:

grinding a side of the semiconductor wafer opposite the front side to define the back side of the semiconductor wafer.

3. The method of claim 1, wherein sawing a second trench comprises:
coupling the sawn front side of the semiconductor wafer to an adhesive carrier;
matching the dicing marks on the front side with a desired saw pattern on the back side; and
singulating a chip by sawing the back side of the semiconductor wafer.

4. The method of claim 1, wherein sawing the front side of the semiconductor wafer comprises transferring a saw pattern to the back side of the semiconductor wafer that is configured to visually guide sawing a second trench in the back side of the semiconductor wafer.

5. The method of claim 1, wherein decoupling the front side from the first carrier comprises cutting along a sloped cut line such that a diameter of the front side of the semiconductor wafer is greater than a diameter of the back side.

6. The method of claim 1, wherein a width of the first trench is greater than a width of the second trench.

7. The method of claim 1, wherein a width of the first trench is about equal to a width of the second trench.

8. A method of making an integrated circuit, the method comprising:
providing a semiconductor water comprising a from side aid a back side opposite the front side, the front side having an active chip surface and coupled to a first carrier, the back side including a metallization layer deposited onto the back side;
forming a first trench in the semiconductor wafer extending from or of the front side and the back side toward the other of the front side and the back side; and
sawing a second trench in the other of the front side and the back side until the second trench communicates with the first trench thus singulating the integrated circuit from the semiconductor wafer,
wherein forming a first trench comprises:
removing an edge portion of the metallization layer;
visualizing a front side kerf pattern by viewing through the removed edge portion of the metallization layer;
aligning the metallization layer and the back side with the front side kerf pattern; and
forming a first trench through the metallization layer and the back side of the semiconductor wafer, the first trench extending part way toward the front side of the semiconductor wafer.

9. The method of claim 8, wherein sawing a second trench comprises:
coupling the metallization layer to an adhesive carrier;
removing the first carrier from the front side of the semiconductor wafer; and
sawing through the front side along the front side kerf.

10. The method of claim 8, wherein visualizing a front side kerf pattern comprises infrared viewing through the removed edge portion of the metallization layer to determine the front side kerf pattern.

11. The method of claim 8, wherein a width of the first trench is greater than a width of the second trench.

12. The method of claim 8, wherein a width of the first trench is about equal to a width of the second trench.

13. The method of claim 8, wherein providing a semiconductor wafer comprises:
grinding a side of the semiconductor wafer opposite the front side to define the back side of the semiconductor wafer.

14. A method of making an integrated circuit, the method comprising:
providing a semiconductor wafer comprising a front side and a back side opposite the front side, the front side having an active chip surface and coupled to a first carrier, the back side including a metallization layer deposited onto the back side;
forming a first trench in the semiconductor wafer extending from one of the front side and the back side toward the other of the front side and the back side; and
sawing a second trench in the other of the front side and the back side until the second trench communicates with the first trench, thus singulating the integrated circuit from the semiconductor wafer,
wherein providing a semiconductor wafer comprises providing a semiconductor wafer having a thickness of about 700 micrometers and forming a first trench comprises sawing a first trench through the metallization layer and the back side of the semiconductor wafer, the first trench extending between about 50-100 micrometers toward the front side of the semiconductor wafer, and
wherein sawing a second trench comprises:
coupling the metallization layer to an adhesive carrier; and
sawing through the front side along the front side kerf.

15. The method of claim 14, wherein a width of the first trench is greater than a width of the second trench.

16. The method of claim 14, wherein a width of the first trench is about equal to a width of the second trench.

17. The method of claim 14, wherein providing a semiconductor wafer comprises:
grinding a side of the semiconductor wafer opposite the front side to define the back side of the semiconductor wafer.

18. A method of making an integrated circuit including singulating a semiconductor substrate, the method comprising:
providing a semiconductor wafer comprising an active surface and a metallized back side opposite the active surface;
sawing the active surface of the semiconductor wafer through a portion of the thickness of the semiconductor wafer; and
dicing the semiconductor wafer by sawing the metallized back side through a remaining portion of the thickness of the semiconductor wafer,
wherein sawing the active surface of the semiconductor wafer comprises attaching the metallized back side to a carrier and sawing streets along a visible kerf pattern that is oriented between chips disposed on the active surface.

19. The method of claim 18, wherein dicing the semiconductor wafer comprises: attaching the sawn active surface to a carrier; and
aligning the semiconductor wafer in a dicing tool such that the metallized back side is aligned with the sawn streets.

20. The method of claim 19, wherein attaching the metallized back side to a carrier comprises laser separating the semiconductor wafer from a carrier wafer such that a diameter of the active surface is greater than a diameter of the back side, the narrower back side configured to enable visualization of the sawn streets.

21. A method of making an integrated circuit including singulating a semiconductor substrate, the method comprising:

provinding a semiconductor wafer comprising an active surface and a metallized back side opposite the active surface;

visualizing through the metallized back side to discern a kerf pattern on the active surface;

sawing streets in the metallized back side that are aligned with the kerf pattern and extend part way toward the active surface; and sawing the active surface of the semiconductor wafer through a remaining thickness of the semiconductor wafer.

22. The method of claim 21, wherein visualizing through the metallized back side to discern a kerf pattern on the active surface comprises removing an edge portion of the metallized back side.

23. The method of claim 22, further comprising:

infrared scanning through the removed edge portion of the metallized back side to identify the kerf pattern.

* * * * *